(12) United States Patent
Hwang et al.

(10) Patent No.: US 9,043,682 B2
(45) Date of Patent: May 26, 2015

(54) PACKET TRANSMISSION/RECEPTION APPARATUS AND METHOD USING FORWARD ERROR CORRECTION SCHEME

(71) Applicant: Samsung Electronics Co. Ltd., Suwon-si, Gyeonggi-do (KR)

(72) Inventors: Sunghee Hwang, Suwon-si (KR); Seho Myung, Seoul (KR); Hyunkoo Yang, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 49 days.

(21) Appl. No.: 13/777,313

(22) Filed: Feb. 26, 2013

(65) Prior Publication Data

US 2013/0227376 A1 Aug. 29, 2013

Related U.S. Application Data

(60) Provisional application No. 61/603,438, filed on Feb. 27, 2012.

(30) Foreign Application Priority Data

Oct. 9, 2012 (KR) .................. 10-2012-0112032

(51) Int. Cl.
*H03M 13/00* (2006.01)
*H03M 13/05* (2006.01)
(Continued)

(52) U.S. Cl.
CPC .......... *H03M 13/05* (2013.01); *H03M 13/2906* (2013.01); *H03M 13/373* (2013.01); *H03M 13/3761* (2013.01)

(58) Field of Classification Search
CPC ............ H03M 13/05; H03M 13/2906; H03M 13/3761; H04L 1/0041; H04L 69/22; H04N 21/2381
USPC .......................................... 714/746, 752, 776
See application file for complete search history.

(56) References Cited

U.S. PATENT DOCUMENTS 7,660,245 B1 2/2010 Luby
7,676,735 B2 * 3/2010 Luby et al. .................... 714/781
(Continued)

FOREIGN PATENT DOCUMENTS

WO 2011-108904 A2 9/2011

OTHER PUBLICATIONS

M.Watson, Basic Forward error correction (FEC) schemes, Mar. 2009, Digital Fountain, Network Working Group, pp. 1 to 18 (retrieved from Google Jul. 10, 2014).*

(Continued)

*Primary Examiner* — Shelly A Chase
(74) *Attorney, Agent, or Firm* — Jefferson IP Law, LLP

(57) ABSTRACT

A packet transmission/reception apparatus and method is provided. The packet transmission method of the present invention includes acquiring a source payload including partial source symbols from a source block, generating a source packet including the source payload and an identifier (ID) of the source payload, generating a repair packet including a repair payload corresponding to the source payload and an ID of the repair payload, generating a Forward Error Correction (FEC) packet block including the source and repair packets, and transmitting the FEC packet block. The source payload ID includes a source payload sequence number incrementing by 1 per source packet. The packet transmission/reception method of the present invention is advantageous in improving error correction capability and network resource utilization efficiency.

20 Claims, 13 Drawing Sheets

(51) Int. Cl.
*H03M 13/29* (2006.01)
*H03M 13/37* (2006.01)

(56) References Cited

U.S. PATENT DOCUMENTS 8,279,755 B2 * 10/2012 Luby .......................... 370/230
2009/0168708 A1 7/2009 Kumar et al.
2009/0307564 A1 12/2009 Vedantham et al.
2011/0219279 A1 9/2011 Abu-Surra et al.

OTHER PUBLICATIONS

M. Watson et al., 'Forward Error Correction(FEC) Framework', IETF, RFC 6363.

* cited by examiner

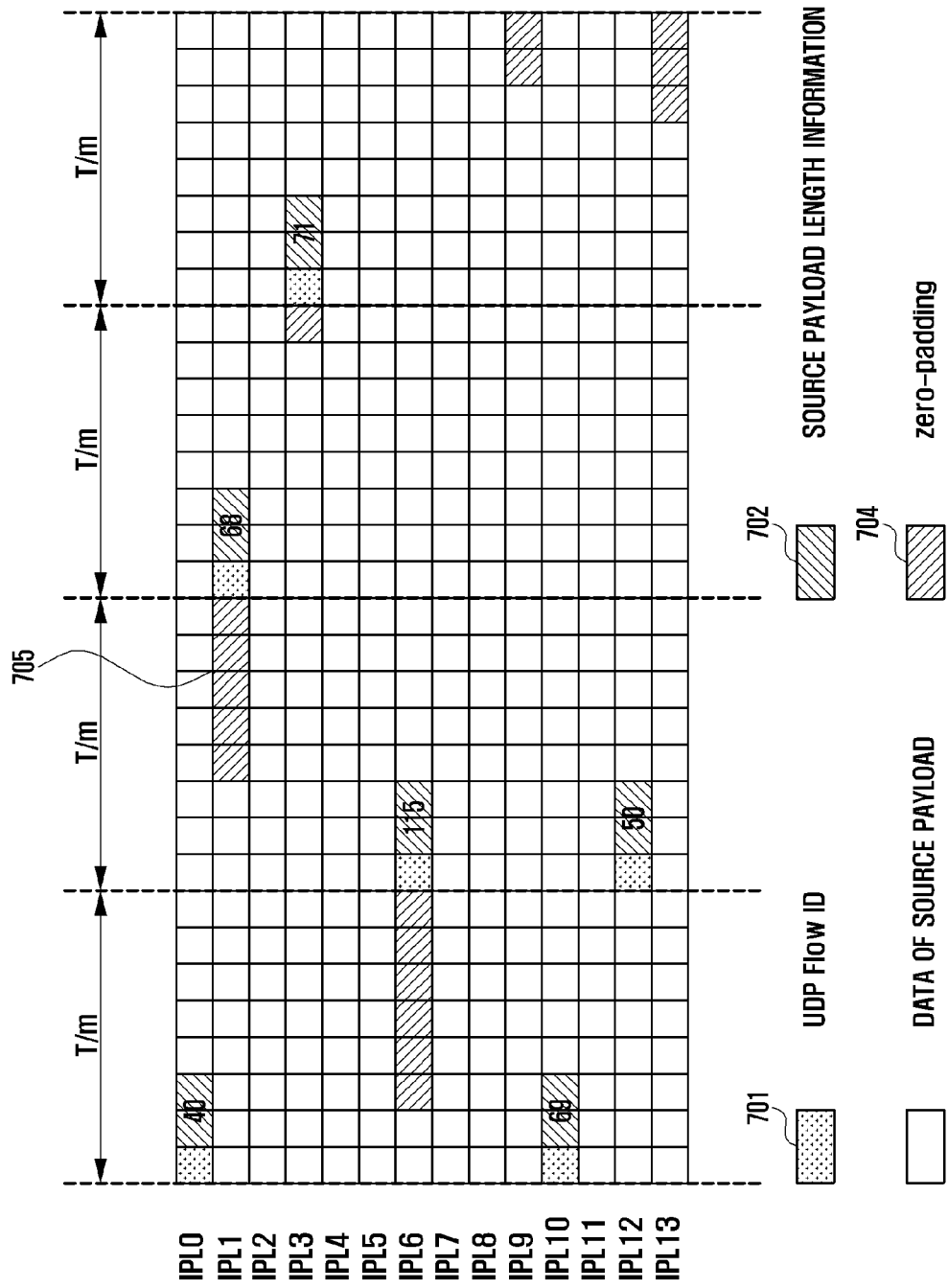

PACKET TRANSMISSION/RECEPTION APPARATUS AND METHOD USING FORWARD ERROR CORRECTION SCHEME

CROSS-REFERENCE TO RELATED APPLICATIONS

This application claims the benefit under 35 U.S.C. §119 (e) of a U.S. Provisional application filed on Feb. 27, 2012 in the U.S. Patent and Trademark Office and assigned Ser. No. 61/603,438, and under 35 U.S.C. §119(a) of a Korean patent application filed on Oct. 9, 2012 in the Korean Intellectual Property Office and assigned Serial No. 10-2012-0112032, the entire disclosure of each of which is hereby incorporated by reference.

BACKGROUND OF THE INVENTION

1. Field of the Invention

The present invention relates to a broadcast and/or communication system. More particularly, the present invention relates to a packet transmission/reception apparatus and method in the broadcast and/or communication system.

2. Description of the Related Art

With an increase of multimedia contents for user consumption, especially high capacity multimedia data, such as High Definition (HD) and Ultra High Definition (UHD) contents, network data congestion has also been increasing more and more in broadcast and communication environments. In this situation, content data transmitted by a transmitter, such as a Host A, may not be delivered to a receiver, such as a Host B, normally, thus resulting in data loss along a routing path. In many cases, the content data are transmitted in units of packets and thus the data loss may occur in a unit of a packet too. The data loss on the network may cause data packet reception failure of the receiver, and thus, it may be difficult for the receiver to recover the data carried in the missing packet. As a consequence, the missing packets may cause audio and video quality degradation with various deleterious effects, such as a cracked screen, a missing subtitle, and a file loss, thus, resulting in user's inconvenience. Accordingly, there is a need of the technique for recovering the missing data.

One of the well-known missing data recovery techniques is to group data packets, so-called source packets, with various lengths into a source block and add parity bits or repair packets to the source block thorough Forward Error Correction (FEC) encoding. In the case that there is missing data, the receiver may be capable of decoding the original data using the repair information. At this time, the source block may include packets of contents that use different transmission reliabilities. If the amount of the repair packets is determined according to the packet using a highest reliability in the source block, then, in the source block, the packets using relatively low reliabilities may be overprotected so as to degrade the efficiency of the network. Otherwise, if the amount of the repair packets is determined according to the packet using the lowest reliability in the source block, the packets using relatively high reliabilities may not be recovered. Therefore, a need exists for an error correction method that is capable of improving error correction efficiency by dividing the source block. Also, there is a need of a method for protecting the packets using relatively high reliabilities using the parities generated with one or more error correction codes.

The above information is presented as background information only to assist with an understanding of the present disclosure. No determination has been made, and no assertion is made, as to whether any of the above might be applicable as prior art with regard to the present invention.

SUMMARY OF THE INVENTION

Aspects of the present invention are to address at least the above-mentioned problems and/or disadvantages and to provide at least the advantages described below. Accordingly, an aspect of the present invention is to provide an intra-band signaling method and apparatus for transmitting/receiving packets in a broadcast and communication system.

Another aspect of the present invention is to provide a method and apparatus for recovering lost packet data efficiently in a broadcast and communication system.

Another aspect of the present invention is to provide a data transmission method and apparatus that may improve an error correction capability and network efficiency simultaneously by dividing source blocks efficiently in a broadcast and communication system.

Another aspect of the present invention is to provide a data transmission method and apparatus that may protect the packets needing relatively high reliability using parities generated with at least one error correction code in a broadcast and communication system.

In accordance with an aspect of the present invention, a packet transmission method is provided. The method includes acquiring a source payload that includes source symbols from a source block, generating a source packet that includes the source payload and a source payload identifier (ID) of the source payload, generating a repair packet that includes a repair payload corresponding to the source payload and a repair payload ID of the repair payload, generating a Forward Error Correction (FEC) packet block including the source packet and the repair packet, and transmitting the FEC packet block, wherein the source payload ID includes a source payload sequence number that is incremented by 1 per source packet that is generated.

In accordance with another aspect of the present invention, a packet transmission apparatus is provided. The apparatus includes a Forward Error Correction (FEC) block generator which acquires a source payload that includes source symbols from the source block, an FEC packet generator which generates both a source packet that includes both the source payload and a source payload identifier (ID) of the source payload and a repair packet that includes both a repair payload corresponding to the source payload and a repair payload ID of the repair payload and which generates a Forward Error Correction (FEC) packet block that includes the source packet and the repair packet, and a transmitter which transmits the FEC packet block, wherein the source payload ID includes a source payload sequence number that is incremented by 1 per source packet that is generated.

In accordance with another aspect of the present invention, a packet reception method is provided. The method includes receiving a source packet that includes a source payload and a source payload identifier (ID) of the source payload, and receiving a repair packet that includes a repair payload corresponding to the source payload and a repair payload ID of the repair payload, wherein the source payload ID includes a source payload sequence number that is incremented by 1 per source packet that is generated.

In accordance with still another aspect of the present invention, a packet reception apparatus is provided. The apparatus includes a receiver which receives both a source packet that includes both a source payload and a source payload identifier (ID) of the source payload and a repair packet that includes both a repair payload corresponding to the source payload and a repair payload ID of the repair payload, wherein the source payload ID includes a source payload sequence number that is incremented by 1 per source packet that is generated.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which:

FIG. 7 is a diagram illustrating an information block structure of an FEC block generator according to another exemplary embodiment of the present invention;

Throughout the drawings, it should be noted that like reference numbers are used to depict the same or similar elements, features, and structures.

DETAILED DESCRIPTION OF EXEMPLARY EMBODIMENTS

Figure 1:
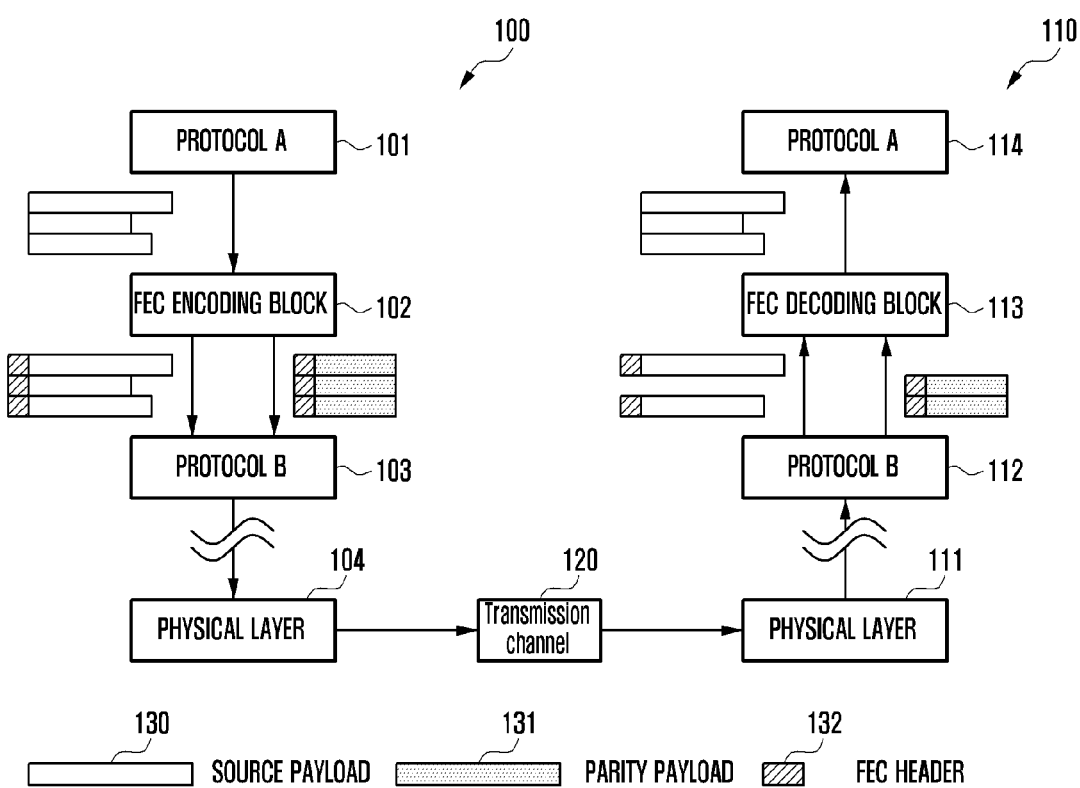
FIG. 1 is a diagram illustrating operations of a transmitter and a receiver of a communication system according to an exemplary embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The exemplary embodiments of the present invention to be described below describe methods for recovering a data packet loss efficiently that may be applied to a mobile terminal, a Television (TV), a computer, an electronic slate, a tablet Personal Computer (PC), an electronic book, and any other suitable and/or similar electronic device that may use various multimedia services, such as high capacity contents, including High Definition (HD) and Ultra HD (UHD) contents, streaming media, video conference and/or call services, or any other similar and/or suitable multimedia service. Particularly, an exemplary embodiment may provide methods for improving decoding performance and transmission efficiency by generating a source block efficiently with the application of Forward Error Correction (FEC) to the data packets. Although no detailed description is made of FEC encoding method herein, the exemplary embodiments of the present invention may be applied to the systems using a Reed-Solomon (RS) code, a Low Density Parity Check (LDPC) code, a Turbo code, a Raptor code, a RaptorQ code, an XOR such as a Single Parity-Check Code, a Pro-Motion Pictures Experts Group (MPEG) FEC code, and any other similar and/or suitable system.

The terms to be used in the present specification are defined as follows: an FEC code may be an error correction code for correcting error or erasure symbol; an FEC frame may be a codeword generated by FEC encoding data to be protected and including a parity or repair part; a symbol may be a unit of data, wherein its size, in bits, may be referred to as the symbol size; a Source Symbol may be an unprotected data symbol which may be an information part of an FEC frame; an information symbol may be unprotected data or a padding symbol which is the information part of an FEC frame; a codeword may be an FEC frame generated by FEC-decoding of the information symbol; a parity symbol may be a parity symbol of the FEC frame generated by FEC encoding from the information symbol; a Packet may be a transmission unit including a header and a payload; a payload may be a piece of user data which is to be transmitted from the transmitter and which is placed inside of a packet; a packet header may be a header of a packet including a payload; a source payload may be a payload consisting of source symbols; an information payload may be a payload consisting of information symbols; a parity payload may be a payload consisting of parity symbols; a source block may be a set of at least one source payload; an information block may be a set of at least one information payload; a parity block may be a set of at least one parity payload; an FEC block may be a set of codewords or payloads including information blocks and parity blocks; an FEC delivery block may be a set of payloads including source blocks and parity blocks; an FEC packet may be a packet for transmitting an FEC block; a source packet may be a packet for transmitting a source block; a repair packet may be a packet for transmitting a repair block; an FEC packet block may be a set of packets for transmitting FEC transmission blocks; a Motion Pictures Experts Group (MPEG) Media Transport (MMT) may be an international standard under development for efficient transmission of MPEG data; a source flow may be a sequence of source packets or source payloads having a same source flow Identifier (ID); a parity flow may be a sequence of source packets or source payloads having a same parity flow ID; an FEC Flow may be a term referring integrally to a source flow and at least one parity flow generated for protecting the source flow; a MMT Asset may be a data entity consisting of one or more M units, which may be a data unit for defining composition information and transport characteristics; and a MMT Package may be a set of one or more MMT assets depending on the supplementary information such as composition information and transport characteristics.

FIG. 1 is a diagram illustrating operations of a transmitter and a receiver according of a communication system according to an exemplary embodiment of the present invention.

Referring to FIG. 1, a transmitter 100 may include a protocol A block 101, an FEC encoding block 102, a protocol B block 103, and a transmitter physical layer block 104. The protocol A block 101 may process the transmission data in order to generate a source payload 130 for the FEC encoding block 102. The FEC encoding block 102 may generate a source block as a set of source payloads and may perform FEC encoding on the source block in order to generate a parity payload 131 and may add an FEC header 132 to the source and parity payloads in order to generate FEC packets for the protocol B block 103.

At this time, a combination of the source payload and the FEC header may be referred to as an FEC source packet, and a combination of the parity payload and the FEC header may be referred to as an FEC parity packet. Although the FEC source packet may be depicted as a data unit acquired by arranging the FEC header and the source payload sequentially, as shown in FIG. 1, the present invention is not limited thereto, and the arrangement order can be reversed or may be any suitable and/or similar arrangement order. Although the FEC encoding block 102 may be interposed between the protocol A block 101 and the protocol B block 103, as shown in FIG. 1, the present invention is not limited thereto, and the protocol A block 101 may also include the FEC encoding block 102. In this case, the FEC parity packet may include a protocol header for performing the function of the protocol A block 101, and the protocol A block 101 may include a multiplexer (not shown) for multiplexing the source and parity packets into a packet flow.

The transmitter physical layer block 104 may convert the FEC packets into a signal appropriate for transmission. Although there may be various layers between the protocol B block 103 and the transmitter physical layer block 104, a detailed description thereof is omitted herein, for the sake of brevity.

A receiver 110 may include a receiver physical layer block 111, a protocol B block 112, an FEC decoding block 113, and a protocol A block 114. The receiver physical layer block 111 may interpret a signal received over a transmission channel 120 and may transfer the signal to the protocol B block 112.

Like the transmitter 100, there may be various layers between the protocol B block 112 and the receiver physical layer block 111, however, a detailed description thereof is omitted herein for the sake of brevity. The protocol B block 112 may transfer the FEC packets acquired by interpreting the received signal or packet to the FEC decoding block 113. At this time, a part of the FEC packets transmitted by the transmitter may be lost due to network congestion and/or an error occurring at the physical layer such that the FEC packets may not be delivered to the FEC decoding block 113. The FEC decoding block 113 may perform FEC decoding on the received FEC packets in order to recover the lost source payloads and may deliver the recovered payloads to the protocol A block 114 along with the received payloads.

Figure 2:
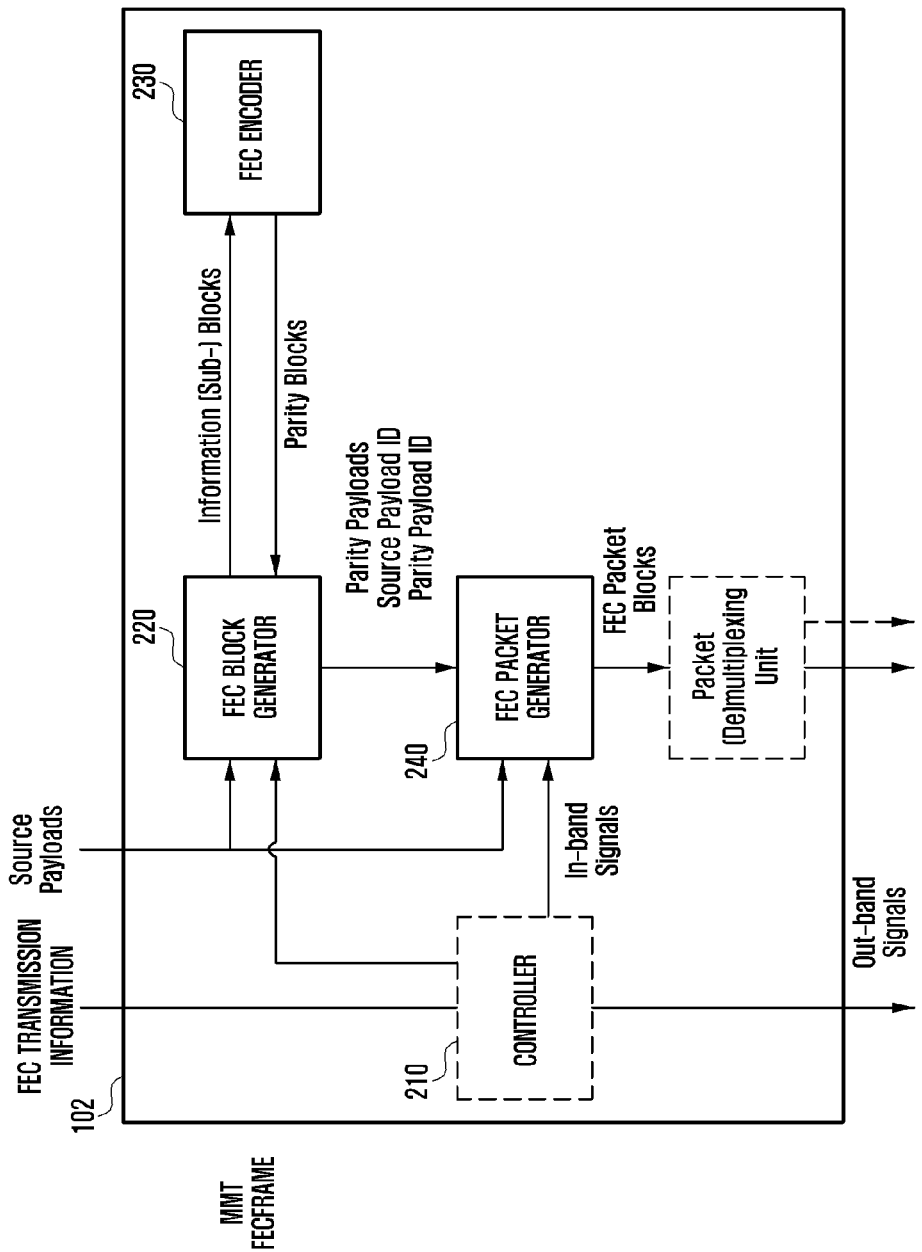
FIG. 2 is a block diagram illustrating a generation of the FEC encoding block of the transmitter of FIG. 1 according to an exemplary embodiment of the present invention.

FIG. 2 is a block diagram illustrating a generation of the FEC encoding block of the transmitter of FIG. 1 according to an exemplary embodiment of the present invention.

Referring to FIG. 2, the FEC encoding block 102 illustrated in FIG. 1 may be implemented as an MPEG MMT FECFRAME 102. The MMT FECFRAME 102 may be a logical/physical component for generating an FEC flow. Accordingly, if at least two FEC flows are managed at the transmitter 100, then the logical FECFRAMEs, a number of which may correspond to as many of the FEC flows that are activated independently, and the physical FECFRAME may be shared with time sharing. The MMT FECFRAME 102 may receive the inputs of a FEC transmission information and a source payload and may output Out-band signal and a FEC packet block. Although FIG. 2 shows the FEC transport information is input to a controller 210 and an FEC block generator 220, the present invention is not limited thereto, and other function blocks may recognize and use the FEC transport information for other operations.

The MMT standard adopts a two-stage method for protecting packets needing relatively high reliability using at least one error correction code. In the two-stage method, the MMT FECFRAME 102 may sort a predetermined number of symbols into M first source symbols, wherein M is an integer equal to or greater than 1, and adds first repair symbols generated through a first FEC encoding to the first source symbols in order to generate first encoding symbols. Next, the MMT FECFRAME 102 may add second repair symbols, which are generated through a second FEC encoding of the M first encoding symbols, as second source symbols in order to generate second encoding symbols. The first and second FEC encodings may be performed with a same error correction code or different error correction codes. Candidate error correction codes may be any of an RS code, an LDPC code, a Turbo code, a Raptor code, an eXclusive OR (XOR) code, or any other similar and/or suitable candidate error correction code or combination thereof.

Figure 3A:
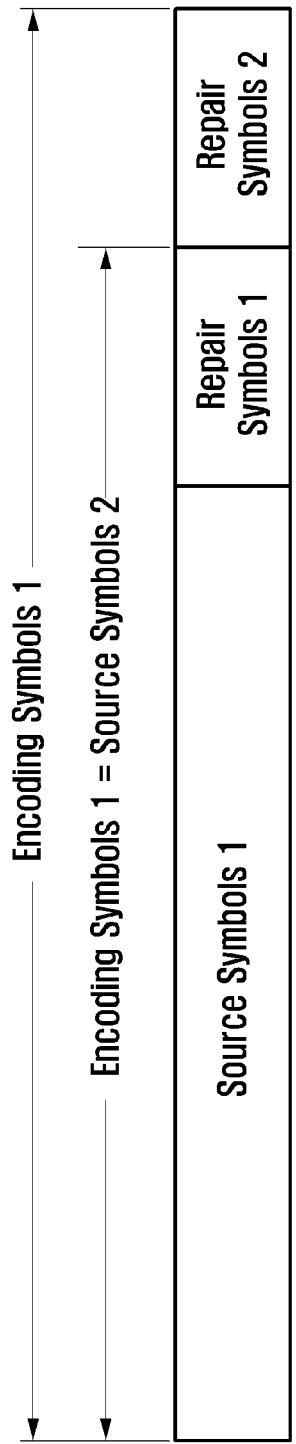
FIGS. 3A and 3B are diagrams illustrating the encoding formats of two-stage Forward Error Correction (FEC) encoding scheme for use in a packet transmission/reception method according to an exemplary embodiment of the present invention.
Figure 3B:
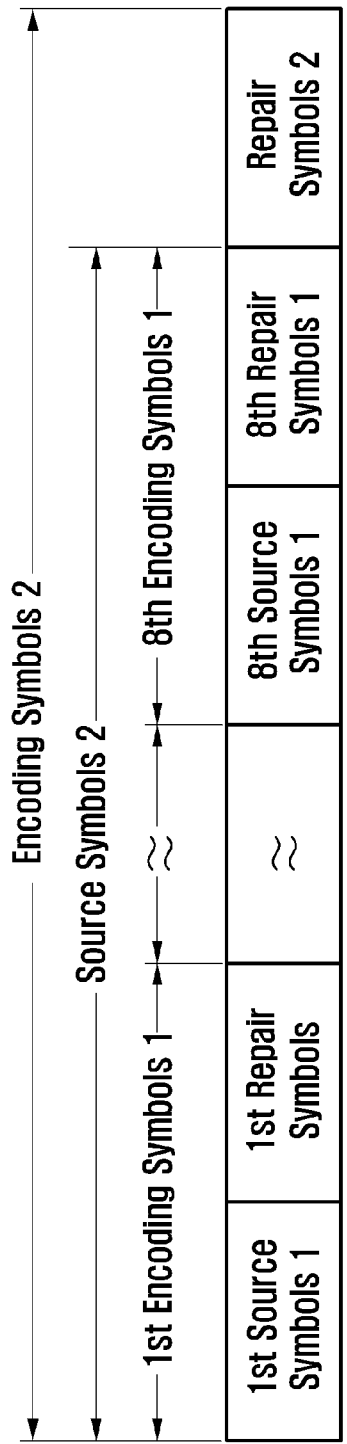

FIGS. 3A and 3B are diagrams illustrating the encoding formats of two-stage FEC encoding scheme for use in a packet transmission/reception method according to an exemplary embodiment of the present invention.

Referring to FIG. 3A, an encoding format in a case where M=1 is shown, and referring to FIG. 3B, an encoding format in a case where M=8 is shown. In order to protect the media data having a layered structure efficiently, a Layer-Aware (LA)-FEC may be used. The media having a layered structure may include contents encoded using Scalable Video Coding (SVC) and Multiview Video Coding (MVC).

Figure 4:
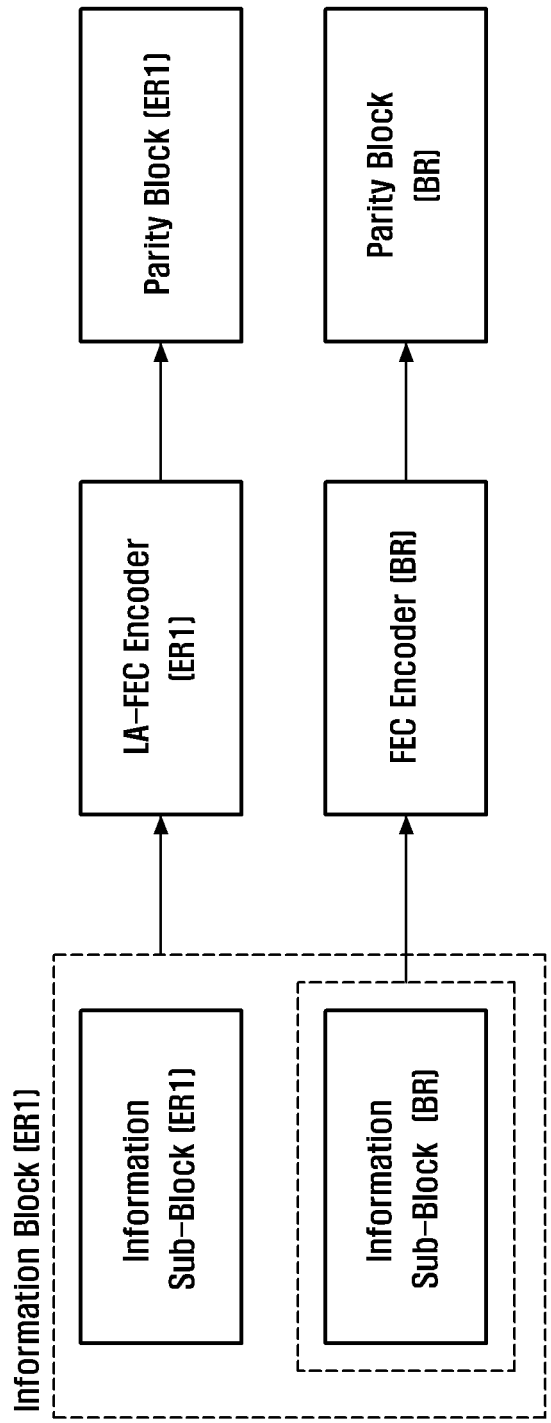
FIG. 4 is a diagram illustrating generating a source block for applying a Layer Aware (LA)-FEC in a case of media with two layers in a packet transmission/reception method according to an exemplary embodiment of the present invention.

FIG. 4 is a diagram illustrating generating a source block for applying a LA-FEC in a case of a media with two layers in a packet transmission/reception method according to an exemplary embodiment of the present invention.

Referring to FIG. 4, a Base Representation (BR) may refer to data that is independently decodable at a media codec, and Enhancement Representation 1 (ER1) may refer to the data depending on the BR. It is noted that the BR may be used along with the ER1 in generating a parity for ER1, as shown in FIG. 4.

Returning to FIG. 2, the controller 210 may generate control information, In-band signals, and Out-band signals using the input of the FEC transport information. The In-band signals may be control information that is transmitted as a part of the FEC packet, and the Out-band signals may be the control information transmitted through a separate packet, protocol, or channel. The FEC transport information may be processed by a separate controller (not shown), which is not included in the MMT FECFRAME 102, without involvement of the controller 210 and may then be input into the FEC block generator 220 and a FEC packet generator 240. In this case, the controller 210 may be omitted, which respect to the block diagram of FIG. 2.

The control information may include the control information needed for generating the FEC block at the FEC encoder 230. A specific FEC code uses an initial value of a random generator for a parity generation procedure. At this time, a sequence number assigned to the source payload at a higher layer may use the initial value of the random generator frequently. In this case, since it may be inefficient to extract a necessary value by analyzing, at the MMT FECFRAME 102, the payload structure of the higher layer by taking notice of the data flow, the identification number may be input to the MME FECFRAME 102 as control information and may be used as the control information of the FEC code, but may not be output as the In-band signal or the Out-band signal. The FEC transport information may include transport characteristics of the MMT asset and changes depending on the application or protocol including the MMT FECFRAME 102.

Referring to FIG. 2, the FEC block generator 220 may receive the source payload and control information as input and may then output the parity payload, the source payload ID, and the parity payload ID. In order to acquire the parity payload, the FEC block generator 220 may group the source payloads into a source block and may processes the source block in order to generate an information block, which may be composed of information payloads having a same length, that are provided to the FEC encoder 230. The source payload identifier and parity payload identifier are the identification information needed for identifying different payloads. The source payload identifier may be omitted when there is identification information for identifying the source payload in the layer or next-order layer including the MMT FECFRAME 102. The source payload identifier and parity payload identifier may be used as input of the FEC encoder 230 according to the implementation of the FEC encoder.

Figure 5:
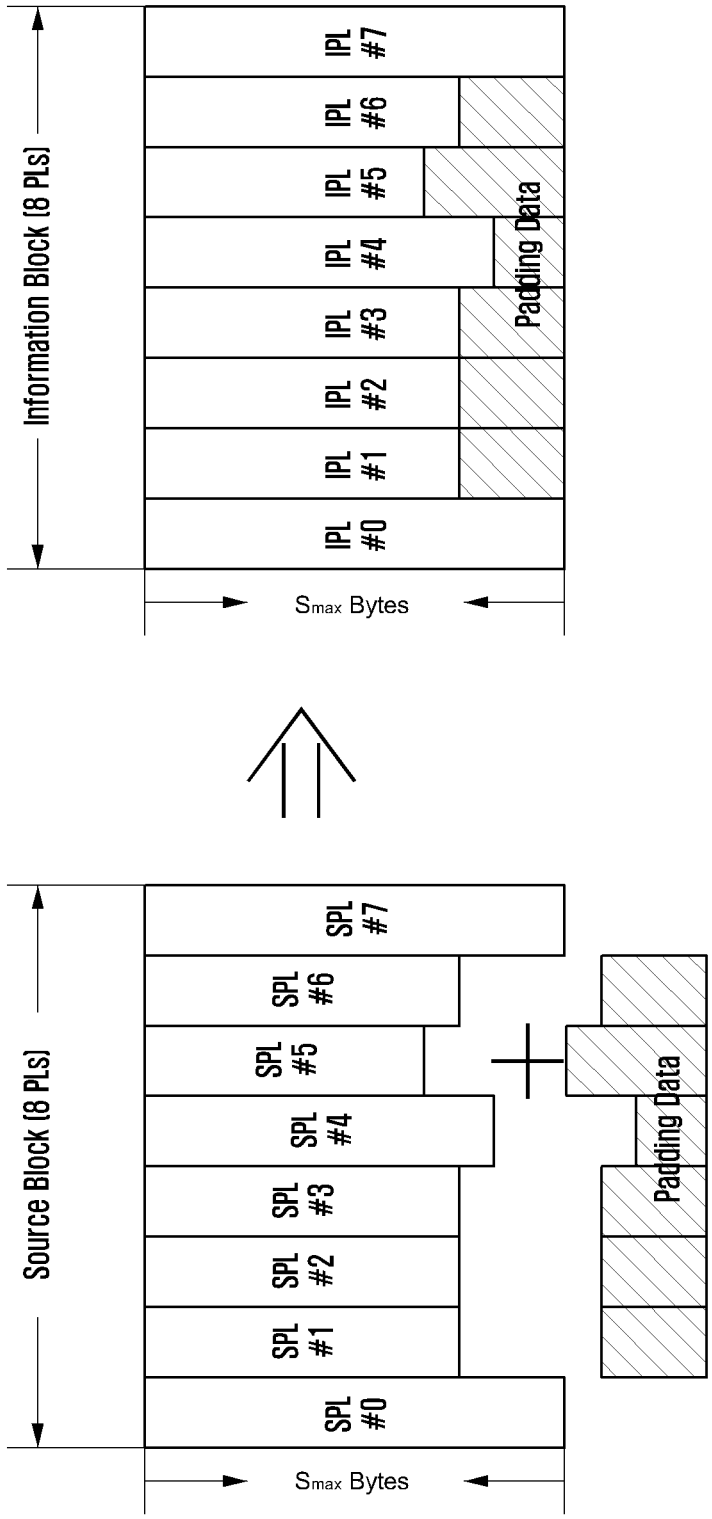
FIG. 5 is a diagram illustrating an information block structure of an FEC block generator according to an exemplary embodiment of the present invention.

FIG. 5 is a diagram illustrating an information block structure of an FEC block generator according to an exemplary embodiment of the present invention.

Referring to FIG. 5, the FEC block generator 220 illustrated in FIG. 2 may receive 8 source payloads, SPL#0 to SPL#7, having variable packet size, as an input. The FEC block generator 220 may generate the information block composed of 8 information payloads, IPL#0 to IPL#7, acquired by adding padding data to the payloads in order to make the payload sizes equal to a maximum length $S_{max}$. Although the exemplary embodiment of FIG. 4 is directed to the case where the maximum length $S_{max}$ of the source payload and a length of the information payload are equal to each other, the present invention is not limited thereto, and the length of the information payload may be set to a value less than $S_{max}$ according to a system complexity and memory requirement.

Figure 6:
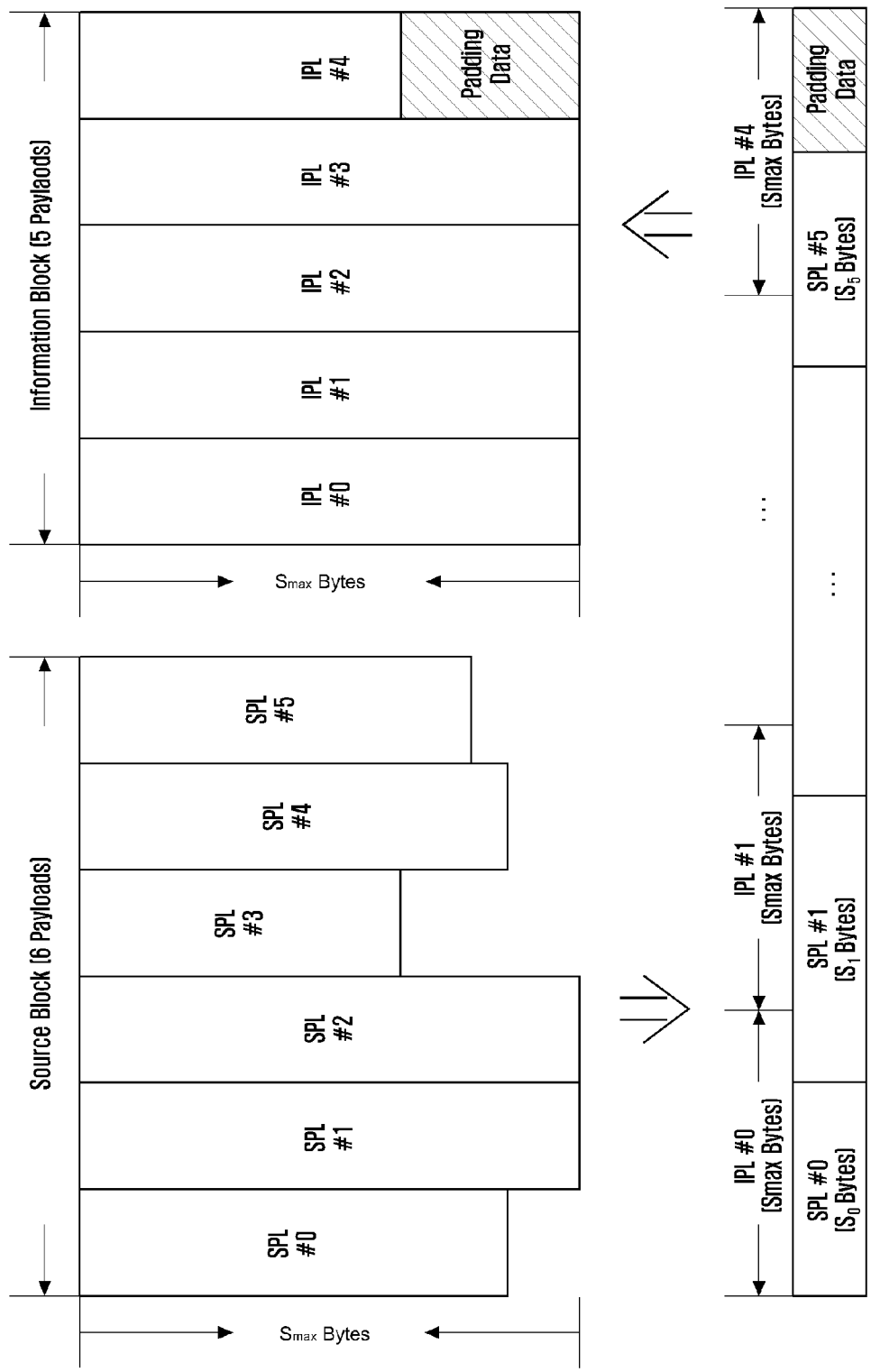
FIG. 6 is a diagram illustrating an information block structure of an FEC block generator according to another exemplary embodiment of the present invention.

FIG. 6 is a diagram illustrating an information block structure of an FEC block generator according to another exemplary embodiment of the present invention.

Referring to FIG. 6, the FEC block generator 220 illustrated in FIG. 2 may receive 6 source payloads, SPL#0 to SPL#5, having variable packet size as an input. The FEC block generator 220 may arrange the payloads in sequence and divides the sequence by the maximum length $S_{max}$ in order to generate the information block composed of 5 information payloads IPL#0 to IPL#4. It is noted that the last information payload may include padding data. According to the exemplary embodiment of FIG. 6, since the source block boundaries and the information payload boundaries do not match with each other, there may be a need to include information, such as source payload length, that is needed for extracting a source payload from the information block, or there may be a need to notify the receiver of the information using a separate method. Although the exemplary embodiment of FIG. 6 is directed to the case where the maximum length $S_{max}$ of the source payload and the length of the information payload are equal to each other, the present invention is not limited thereto, and the length of the information payload may be set to a value less than $S_{max}$ according to a system complexity and memory requirement.

FIG. 7 is a diagram illustrating an information block structure of an FEC block generator according to another exemplary embodiment of the present invention.

Referring to FIG. 7, the FEC block generator 220 illustrated in FIG. 2 may sort a 2-dimensional array having a symbol size of T into m regions according to columns of the 2-dimensional array. FIG. 7 shows a case where m=4. If T is not an integer of m, each region may be divided into regions composed of [T/m]+1 columns and regions composed of [T/m] columns, wherein for any value of a real number X, [X] denotes a maximum integer that is equal to or less than X. A number of columns of each region may be determined through pre-negotiation between the transmitter and the receiver or by enumerating the number of columns of each region. For example, if a remainder of dividing T by m is n, wherein n<m, then a first region of n may be divided into [T/m]+1 columns and a region of m-n may be divided into [T/m] columns. However, the present invention is not limited thereto, and in addition to the above regular region distribution, the number of columns constituting each region may be determined differently through negotiation between the transmitter and the receiver or by any similar and/or suitable means.

If needed, a User Datagram Protocol (UDP) Flow ID 701 and a source payload length information 702 may be added to the source payload. The source payloads to which the UDP Flow ID 701 and the source payload length information 702 are added are arranged from a first row and a first column without exceeding a symbol size of T. At this time, a space that remains empty after arranging the last data of the source payload in the last row, in which a certain source payload having the supplementary information has been arranged, is filled or configured with predetermined values. Although the predetermined values may be zeros, the present invention is not limited thereto, and the predetermined values may be any similar and/or suitable values. For example, the last data of the first source payload may be arranged in the second region from among the 4 regions, and then a remaining part 705 of the second region may be padded with 0s.

After the source payload having the supplementary information has been arranged, a next source payload may be arranged from a start point of a next region following the region in which the last row data of the previous source payload has been arranged. That is, all source payloads are arranged from a start point of any region. For example, the second source payload may be arranged from the start point of the third region following the zero padding of the remaining part 705 in FIG. 7. If a zero padding 704 of the fourth source payload is placed at an end of the fourth region, then a fifth source payload may start at a beginning of the next row of the first region. The given source payloads may be arranged in order to generate the information block. In a case of using plural information block generation schemes, like the MMT system, there may be a need to send the receiver an identifier, such as ibg_mode, indicating the information block generation scheme.

In a case of using the two-stage method, the information block generation procedure may be performed as follows. In such a case, a source block may consist of M sub-blocks. The source payload of the first one of the sub-blocks may be used to generate the first information sub-block which may be transferred to the FEC encoder 230. The FEC encoder 230 may generate a parity payload using the information sub-block and may transfer the parity payload to the FEC block generator 220. This procedure may be performed repeatedly for the second to $M^{th}$ sub-block. When the parity payloads of all sub-blocks are generated, then the first to $M^{th}$ information sub-blocks may be combined into an information block, which may be transferred to the FEC encoder 230. The FEC encoder 230 may generate a parity payload using the information block and may transfer the parity payload to the FEC block generator 220. Next, the parity payloads generated from the M information sub-blocks and the parity payload generated from the information block may be transferred to the packet generator 240.

In the case of using the LA-FEC method, the information block generation procedure is performed as follows. In such a case, the media may have M layers and the $i^{th}$ layer may depend on the $1, 2, \ldots, (i-1)^{th}$ layers. At this time, the source block may consist of M sub-blocks, and the ith sub-block may correspond to the data of the $i^{th}$ layer. The first information sub-block may be generate using the source payload of the first sub-block and may be transferred to the FEC encoder 230. The FEC encoder 230 may generate a parity payload using the first information sub-block and may transfer the parity payload to the FEC block generator 220. Afterward, the first information sub-block and the second information sub-block are combined into an information block which is transferred to the FEC encoder 230. The FEC encoder 230 may generate a parity payload using the information block and may transfer the information block to the FEC block generator 220. This process may be performed repeatedly in order to combine the first through $M^{th}$ information sub-blocks into an information block, which is transferred to the FEC encoder 230. The FEC encoder 230 may generate the parity payload using the information block and may transfer the information block to the FEC block generator 220. The parity payloads generated from the M information sub-blocks and the information block may be transferred to the FEC packet generator 240.

Referring to FIG. 2, the FEC encoder 230 may calculate the parity symbols using the input of the information block according to a predetermined FEC encoding algorithm and may generate the parity payload composed of the parity symbols, wherein the parity payload is output in the form of a parity block. According to an exemplary embodiment, the FEC encoding algorithm may calculate a fixed number of parity symbol values with the input of a fixed number of information symbols. In this case, the FEC encoder 230 may not need extra control information. According to another exemplary embodiment, the FEC encoding algorithm may request the FEC encoding information according to a relationship between the numbers of information and parity symbols and information and parity symbols. Although the FEC encoding information may be part of the FEC transport information transferred from the FEC block generator 220 to the FEC encoder 230, all function blocks of the MMT FEC-FRAME 102 may receive, determine and/or use the FEC transport information as aforementioned.

Referring to FIG. 2, the FEC packet generator 240 may generate an FEC packet including a source or parity payload, a source or parity payload identifier, and In-band signals in the form of an FEC packet block. Although the source or parity payload identifier and In-band signals are depicted separately in FIG. 2, the present invention is not limited thereto, and the In-band signal may include the source or parity payload identifier.

In the MMT system, the source payload may be an MMT Payload Format (PF) or an MMT Transport Packet (TP). The MMT PF may be the output of a D1 protocol as the first transport layer of the MMT, and the MMT TP may be the output of a D2 protocol as the second transport layer of the MMT. The input to the D1 protocol may be a D1 payload. The D1 and D2 protocols may have respective headers.

Figure 8A:
FIGS. 8A and 8B are diagrams illustrating formats of an FEC source packet for use in a packet transmission/reception method according to an exemplary embodiment of the present invention.
Figure 8B:

FIGS. 8A and 8B are diagrams illustrating formats of an FEC source packet for use in a packet transmission/reception method according to an exemplary embodiment of the present invention.

Referring to FIG. 8A, a format of an FEC source packet carrying an MMT PF as the source payload is shown. Referring to FIG. 8B, a format of an FEC source packet carrying MMT TP as source payload is shown. In FIGS. 8A and 8B, shadowed parts may indicate data, i.e. a source payload, protected by an FEC code. In order to maintain a consistency of the protocol packet format and a sequential arrangement of the source payloads in the packet, the FEC In-band signals may be arranged in a last part of the FEC source packet. In the case where the source payload is the MMT PF, the D1 header and payload may be the source payload. In the case where the source payload is the MMT TP, then the D2 header, the D1 header and payload may be the source payload. The FEC parity packets may carry one or more parity payloads. The parity payload may be used for recovering the information block in the format of the MMT PF or the MMT TP.

Figure 9A:
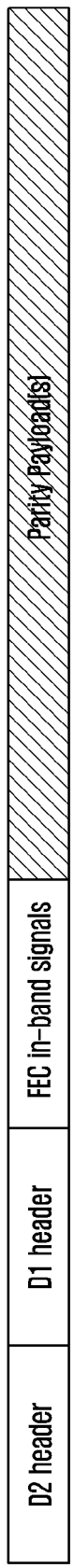
FIGS. 9A and 9B are diagrams illustrating formats of a parity packet for use in a packet transmission/reception method according to an exemplary embodiment of the present invention.
Figure 9B:

FIGS. 9A and 9B are diagrams illustrating formats of a parity packet for use in a packet transmission/reception method according to an exemplary embodiment of the present invention.

Referring to FIG. 9A, the MMT PF of the source payload is shown. Referring to FIG. 9B, the format of MMT TP of the source payload is shown. In FIGS. 9A and 9B, the shadow parts may indicate the data, such as a parity payload, that may be used to recover the information block. In FIGS. 9A and 9B, in order for the receiver to acquire the FEC information quickly, the FEC In-band signal may be arranged between the transport protocol header and the parity payload. In a case having the MMT TP, the parity payload may be only used for recovering the information block in the format of the MMT TP, and thus, the FEC parity packet of FIG. 9B may have no D1 header. In a case of using the two-stage method, the FEC parity packet including the parity payload generated through the first FEC encoding may be referred to as the first FEC parity packet, and the FEC parity packet including the parity payload generated through the second FEC encoding may be referred to as the second FEC parity packet. In a case of the two-stage method, wherein M=1 and the first FEC code has no parity, such a case is identical with the one stage method, and thus the second FEC parity packets may be regarded as the FEC parity packets.

With respect to the method for generating the source payload identifier and parity payload identifier according to an exemplary embodiment of the present invention, certain parameters are defined as follows: k may be a number of source payloads contained in one source block; M may be a number of source sub-blocks constituting one source block; k(i) may be a number of source payloads included in $i^{th}$ source sub-block; S(j) may be a length of a $j^{th}$ source payload constituting a source flow; $S_{max}$=max {S(j)}−T may be a length of the information payload; A(j)=ceil (S(j)/T), ceil(x) may be a minimum integer equal to or greater than x; K may be a number of information payloads included in an information block; K(i) may be a number of information payloads included in the $i^{th}$ information sub-block; P may be a number of parity payloads included in a parity block for protecting information; P(i) may be a number of parity payloads included in the parity block for protecting the $i^{th}$ information sub-block; B may be a number of parity payloads included in one parity packet; p may be a number of parity packets needed for transmitting the parity block generated for protecting the source block which may be equal to ceil(P/B); and p(i) may be a number of parity packets needed for transmitting the parity block generated for protecting the $i^{th}$ source sub-block (=ceil (P(i)/B)).

The source payload identifier and the parity payload identifier, according to an exemplary embodiment of the present invention, are shown in tables 1 and 2.

TABLE 1

| ESI_SN |
| ESI_SN_Base |

TABLE 2

| ESI_SN_Base |
| ESI_P |
| IBL |
| PBL |

The individual fields of tables 1 and 2 are described below. The Encoding Symbol ID Sequence Number (ESI_SN)field may denote the sequence number of the information payload included in the source packet. The difference of between respective ESI_SNs of the current packet and the next packet may be equal to the number of information payloads included in the current packet. The initial value of the sequence number may be set to a value generated randomly and initialized to 0 after reaching a maximum integer value that may be expressed with 2 bytes or any other predetermined number of bytes.

The ESI_SN_Base field may be used optionally in the source packet. If the ESI_SN_Base is included in the source packet, then the field is set to a value equal to ESI_SN of the first source packet of the source block to which the packet belongs and corresponds to the boundary information of the source block to which the source packet belongs. If the ESI_SN_Base is included in the first FEC parity packet, then the field is set to a value equal to ESI_SN of the first source packet included in the source sub-block protected by the parity payloads included in the parity packet. If the ESI_SN_Base is included in the second FEC parity packet, then the field is set to a value equal to ESI_SN of the first source packet included in the source block protected by the parity payloads included in the parity packet.

The ESI_P field may denote the sequence number of the parity payload included in the parity packet. The ESI_P field may indicate the value increasing by 1 from 0 in each parity block and, if one parity packet includes a plurality of parity payloads, may indicate a minimum value from among the sequence numbers of the parity payloads.

The IBL field may denote the number of information payloads included in the information (sub-) block protected by the parity payload(s) in the parity packet.

The PBL field may denote the number of parity payloads constituting a parity block corresponding to the parity payload(s) including parity packet. The PBL field may not be required according to the characteristic of the FEC code. In further detail, the PBL flied may not be needed for the fountain code, which is logically capable of generating parity payloads infinitely, and the PBL field may be needed for the normal (N, K) block codes.

Figure 10:
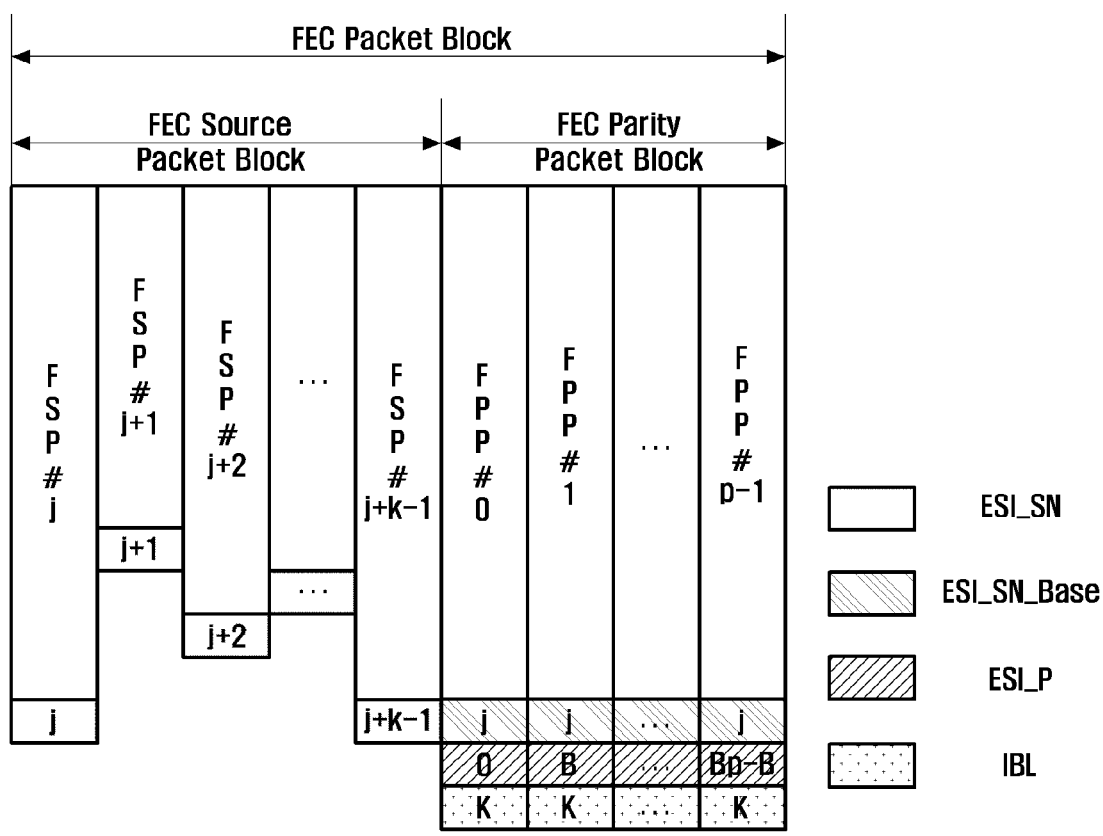
FIGS. 10 and 11 are diagrams illustrating implementing source and parity payloads identifiers for use in a packet transmission/reception method according to an exemplary embodiment of the present invention.
Figure 11:
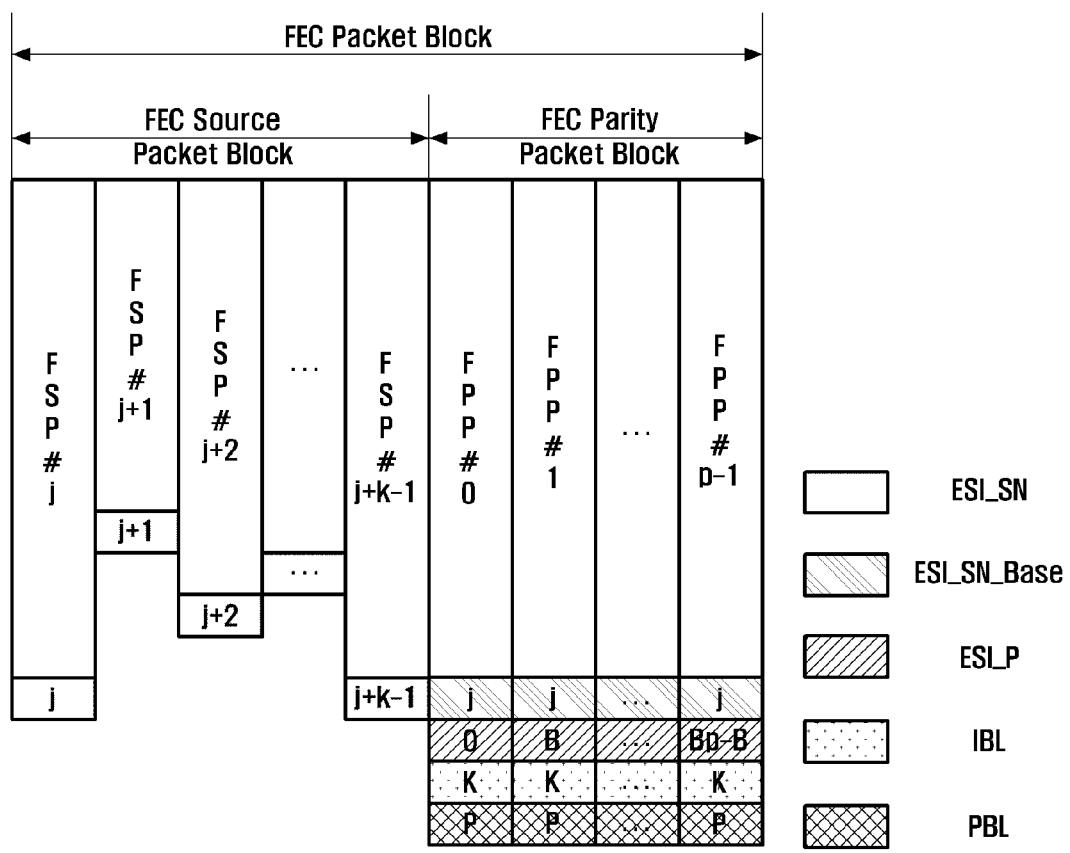

FIGS. 10 and 11 are diagrams illustrating implementing source and parity payloads identifiers for use in a packet transmission/reception method according to an exemplary embodiment of the present invention.

Referring to FIG. 10, an exemplary case of using the fountain code is shown. Referring to FIG. 11, an exemplary case of using a block code is shown. In the exemplary embodiment of FIG. 10, P may be omitted in the parity payload identifier of FIG. 10.

Figure 12:
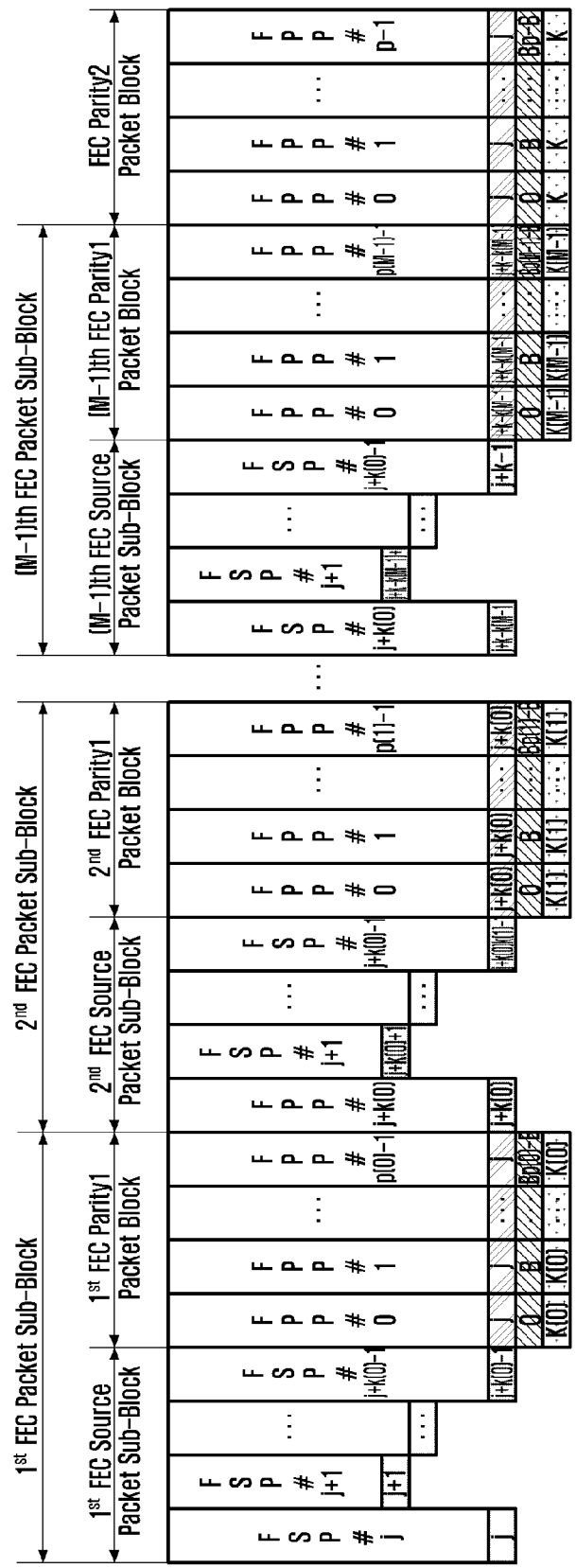
FIGS. 12 and 13 are diagrams illustrating implementing source and parity payloads identifiers with a two-stage method for use in a packet transmission/reception method according to an exemplary embodiment of the present invention.
Figure 13:
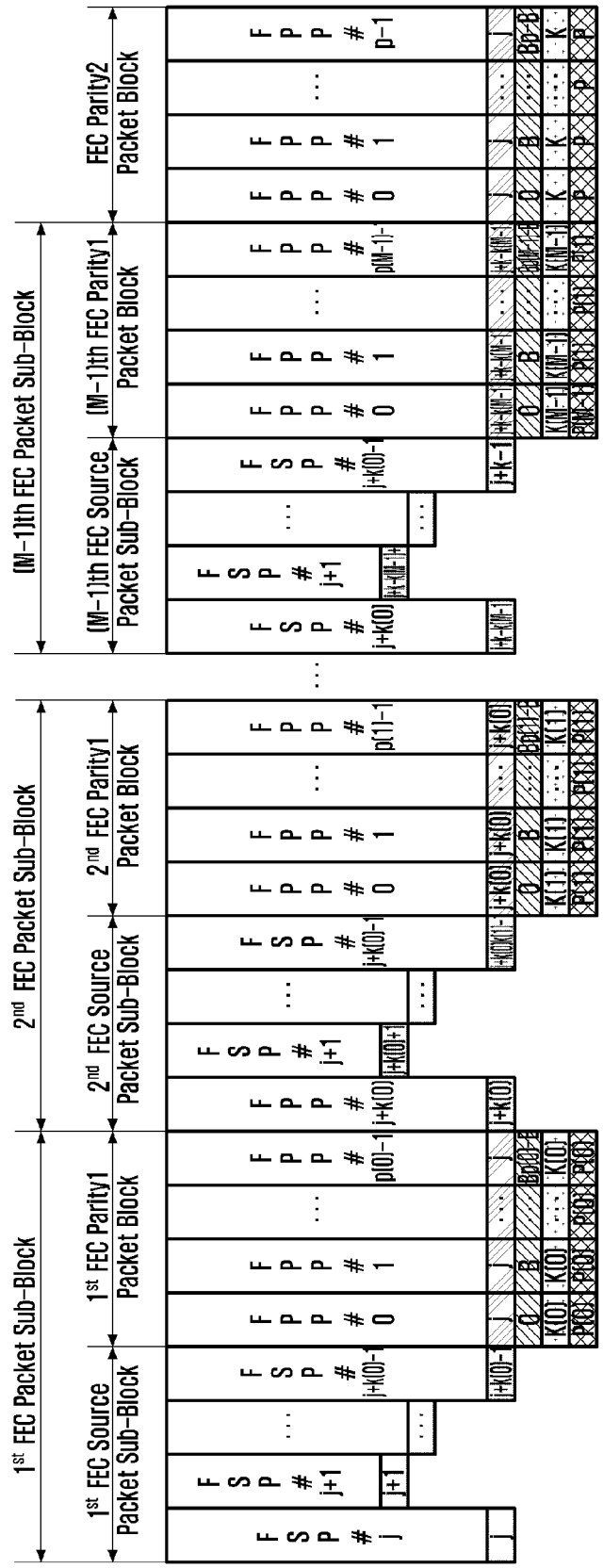

FIGS. 12 and 13 are diagrams illustrating implementing source and parity payloads identifiers with a two-stage method for use in a packet transmission/reception method according to an exemplary embodiment of the present invention.

Referring to FIG. 12, an exemplary case of using the fountain code is shown. Referring to FIG. 13, an exemplary case of using the block code shown. In the exemplary embodiment of FIG. 12, P may be omitted in the parity payload identifier.

Rules for generating respective fields are similarly applied to the exemplary embodiments of FIGS. 10, 11, 12, and 13. The rules are as follows:

ESI_SN=RN if j=0, otherwise ESI_SN_pre+A(j−1), wherein RN is a random number or 0 and ESI_SN_pre is ESI_SN of the previous Source Packet;

ESI_SN=ESI_SN of the first Source Payload of the Source/Sub-Block associated with the Parity Block which includes the FEC Parity Packet;

ESI_P=r*B, wherein r=0, 1, 2, . . . , p−1; and

IBL=K(i) if the Parity Block which includes the FEC Parity Packet is for the $i^{th}$ Sub-Block of the Source Block, otherwise K; PBL=P(i) if the Parity Block which includes the FEC Parity Packet is for the $i^{th}$ Sub-Block of the Source Block, otherwise P.

In the previous exemplary embodiments, the FEC identifier is shown to be arranged at the end of the FEC packet. However, the present invention is not limited thereto. For example, the FEC identifier of FEC parity packet may be arranged at the beginning of the FEC packet, while the FEC identifier of the FEC source packet may be arranged at the end, in the FEC packet. Also, both the FEC identifiers may be arranged at the beginning of the FEC packet. Although not depicted in the previous exemplary embodiments, the FEC Payload ID format may include the FEC Flow Identifier too. In a case where no FEC is applied, the non-FEC application may be notified through Out-bound signaling, wherein the FEC flow identifier may be not needed. Accordingly, when the FEC is applied to all of the source flows, the FEC application may be notified through the Out-band signaling while the FEC flow identifies may be transmitted in the FEC identifier format though the In-band signaling. If the FEC is not applied to all source flows, then the source payload header or the lower layer protocol header may include an FEC flag in order to indicate a presence or absence of the FEC payload identifier and, if the FEC payload identifier is present, then the FEC payload identifier may be transmitted along with the FEC flow identifier. In this case, the receiver may sort the FEC packets by FEC flow identifier from the FEC payload identifier and may decode a corresponding FEC block in the FEC packet blocks having the same FEC flow identifier in order to recover the lost source payload.

A description is made of the FEC encoding procedure of the transmitter according to the present exemplary embodiment hereinafter. The transmitter may segment the media content to be transmitted into source payloads in order to generate a sequence of source payloads and may differentiate among the source flows according to whether the FEC protection is applied, an FEC type to be applied, an FEC coding structure, and a media characteristic or a Quality of Service (QoS), such as lossy or lossless QoS, in order to assign an appropriate Flow Identifier. The FEC flow identifier of each source flow may be stored in a packet carrying the source flow to be notified to the receiver. For example, if an FEC flow identifier=0, then this may indicate that the FEC protection is not applied and, otherwise if an FEC flow identifier≠0, then this may indicate that the FEC protection is applied. However, the present invention is not limited thereto, and an FEC protection scheme may be applied according to any similar and/or suitable manner.

The transmitter may send the receiver the information on whether to apply the FEC protection, the applied FEC type, the FEC coding structure, an Information Payload Size T, an ibg_mode, or any other similar and/or suitable characteristic, through Out-band signaling. Accordingly, the receiver may acquire the information using the FEC flow identifier. The transmitter may transmit the information using a Session Description Protocol in a Session Setup procedure or using a specific packet other than the FEC packet.

The transmitter may apply the FEC encoding indicated by the FEC flow identifier to the corresponding source flow. For this purpose, the transmitter may divide the source flow into source blocks. The transmitter may convert the source block into the information block or sub-block according to the FEC coding structure, which may be a one stage or a two stages structure, and an ibg_mode. The transmitter may generate the parity block(s) from the information block or sub-block using a respective FEC code. The transmitter may generate the FEC packet block for transmitting the source block and the generated parity block, and each FEC packet may include the information on FEC flow identifier, the FEC payload identifier, and the payload type. The transmitter may use the payload type information to determine whether the corresponding FEC packet is a source packet or a parity packet. When the two-stage FEC coding is applied, the transmitter may discriminate between the parity 1 and parity 2. The transmitter may transmit the FEC packet block through the network.

A description is made of the FEC decoding procedure of a receiver according to the present exemplary embodiment hereinafter. The receiver may determine the FEC flow identifier of each source flow, whether FEC protection is applied or not, the FEC type, the FEC coding structure, the information payload size T, the ibg_mode, and other similar parameters that are transmitted by the transmitter through the out-band signaling and may prepare for FEC decoding. The receiver may sort the received FEC packets according to an FEC flow identifier. The receiver determines whether the corresponding FEC packet is the FEC source packet or FEC parity packet according to the payload type information in the FEC packet sorted by the FEC flow identifier. In the case that the two-stage FEC coding is applied, the receiver may determine whether the rec parity packet is the parity 1 or parity 2. If the corresponding FEC packet is the FEC source packet, the receiver may determine the ESI_SN from the source FEC payload ID and, otherwise if the corresponding FEC packet is the parity FEC packet, the receiver may determine the ESI_SN_Base, the ESI_P, IBL, the PBL, or other similar parameters, from the source FEC payload ID. The receiver may arrange the information block or parity block corresponding to the payloads, which may be one of a source or a parity payload, of the FEC packet according to the determined FEC payload ID and the previously recognized information payload size T and ibg_mode at the correct position in order to generate the FEC block for FEC decoding. The receiver may perform decoding with the FEC code applied to the generated FEC block in order to recover the information payload corresponding to the lost source payload during transmission. If padding data are added to the recovered information payloads, then the receiver may remove the padding data in order to finally recover the source payloads. If the information block generation scheme, as depicted in the exemplary embodiment of FIG. 5, is used and if the source payload length fields are configured to be separate from the FEC block, the receiver may decode the FEC block for the length field in order to know the length of each payload and in order to remove the padding data from the recovered information payload.

According to another exemplary embodiment, the fields of tables 1 and 2 are defined as follows:

ESI_SN=RN if j=0, otherwise ESI_SN_pre+A(j−1), wherein RN is a random number or 0 and ESI_SN_pre is ESI_SN of the previous Source Packet;

ESI_SN_Base=ESI_SN of the first Source Payload of Source Block which includes the FEC Source Packet;

ESI_SN=ESI_SN of the first Source Payload of Source/Sub-Block associated with the Parity Block which includes the FEC Parity Packet;

ESI_P=r*B, wherein r=0, 1, 2, ..., p−1;

IBL=K(i) if the Parity Block which includes the FEC Parity Packet is for the ith Sub-Block of the Source Block, otherwise K; and PBL=P(i) if the Parity Block which includes the FEC Parity Packet is for ith Sub-Block of the Source Block, otherwise P.

In the case of using the information block generation method of FIG. 6, the following field may be included in the FEC parity payload identifier: SBL may be a number of source payloads included in the source block or sub-block protecting the parity payload belonging to the parity packet.

In the case of using the information block generation method of FIG. 7, there may be, in the information payload corresponding to the sequence number, a need for the information indicating the start position of the source payload included in the source packet along with the sequence number of the information payload. The information block of FIG. 7 may include 6 source payloads. At this time, the sequence number may be assigned in the form of (0, 0), (1, 2), (6, 1), (10, 0), and (12, 1), which are row-start region pairs. According to another exemplary embodiment, the sequence number may assigned in units of information payload with the start point of the source payload of 0, 6 which is equal to 1*4+2, 15 which is equal to 3*4+3, 25 which is equal to 6*4+1, 40 which is equal to 10*4, and 49 which is equal to 12*4+1.

The source payload identifier and the parity payload identifier, according to another exemplary embodiment of the present invention, are shown in Tables 3 and 4.

TABLE 3

SB_ID
IP_ID_SB
SSB_ID
IP_ID_SSB

The individual fields of Table 3 may denote the following: a Source Block IDentifier (SB_ID) may be an identifier of the source block to which the source payload included in the source packet belongs; an Information Payload IDentifier within a Source Block (IP_ID_SB) may be an identifier of the information payload included in the packet corresponding to the information block generated from the source block indicated by the SB_ID; a Source Sub-Block IDentifier (SSB_ID) may be an identifier of the source sub-block to which the source payload included in the source packet belongs, wherein the SSB_ID field may be included only when the two-stage method is used; and an Information Payload IDentifier within a Source Sub-Block (IP_ID_SSB) may be an identifier of the information payload included in the packet corresponding to the information sub-block generated by converting the source sub-block indicated by the SSB_ID, wherein the IP_ID_SSB field may be included only when the two-stage method is used.

TABLE 4

SB_ID (SSB_ID)
PP_ID
IBL (ISBL)
PBL

The individual fields of table 4 may denote the following. An SB_ID or SSB_ID may be an identifier of a source block or source sub-block protected by the parity block including the parity payload carried in the parity packet. The SSB_ID may be assigned to the first FEC parity packet, and the SB_ID is assigned to the second FEC parity packet. A Parity Payload IDentifier (PP_ID) may be an identifier of the parity payload in the parity block to which the parity payload carried by the parity packet belongs. An Information Block Length (IBL) or an Information Sub-Block Length (ISBL) may be a number of information payloads included in the information block or information sub-block protected by the parity block to which the parity payload carried in the parity packet belongs. The IBL may be assigned to the first FEC parity packet, and the ISBL may be assigned to the second FEC parity packet. A Parity Block Length(PBL) may be a number of parity payloads included in the parity block to which the parity payload carried in the parity packet belongs.

In the case of using the one stage method, the individual fields of the FEC payload identifier of Tables 3 and 4 may be generated as follows. Typically, the SB_ID may increase by 1 from a certain value that is in the range of integers expressible with 2 bytes. The SB_ID may be initialized to 0 after reaching the maximum expressible value. The IP_ID_SB may increase from 0 by 1 per information payload in each source block. In the case of using the information block generation method of FIG. 7, the IP_ID_SB may increase by 1 per segmented information payload. In the case of the information block shown in FIG. 7, the IP_ID_SB field of each FEC source payload identifier is 0, 6, 15, 25, 40, and 49 as described according to the above-described exemplary embodiment. The PP_ID may increase from 0 by 1 per parity payload in each parity block. Typically, the IP_ID_SB and the PP_ID are values that are in the range of integer values expressible with 2 bytes, that is values that are less than 64000. The values associated with the payload of a specific FEC packet may be carried at a part of the FEC parity payload, but the maximum values of the IBL and the PBL may be transmitted in the form of the FEC Out-band signal.

In a case where the two-stage method is used, the individual fields of the FEC payload identifier of Tables 3 and 4 may be generated as follows. Typically, the SB_ID may increase by 1 from a certain value that is in the range of integers expressible with 2 bytes. The SB_ID may be initialized to 0 after reaching the maximum expressible value. The IP_ID_SB may increase from 0 by 1 per information payload in each source block. The SSB_ID may be a positive integer starting from 0 in each source block and increases by 1 per source sub-block of a respective source block. In the case of using the information block generation method of FIG. 7, the IP_ID_SB and IP_ID_SSB may increase by 1 per segmented information payload. The PP_ID may increase from 0 by 1 per parity payload in each parity block. Typically, the IP_ID_SB, the IP_ID_SSB, and the PP_ID may be values in the range of integer values expressible with 2 bytes.

As described below, the FEC source payload identifier generation rules are described with respect to the case of using the two-step method with reference to the case where the source block is divided into two source sub-blocks, wherein each source sub-block includes two source payloads. For the purpose of convenience, it may be assumed that the source payload and the information payload have a 1:1 relationship. At this time, the FEC source payload identifiers SB_ID, IP_ID_SB, SSB_ID, and IP_ID_SSB of the source packets SP#0, SP#1, . . . , SP#15 are as follows.

SP#0: (0, 0, 0, 0)
SP#1: (0, 1, 0, 1)
SP#2: (0, 2, 1, 0)
SP#3: (0, 3, 1, 1)
SP#4: (1, 0, 0, 0)
SP#5: (1, 1, 0, 1)
SP#6: (1, 2, 1, 0)
SP#7: (1, 3, 1, 1)

At this time, assuming that the number of source sub-blocks per source block M is 2 and is transferred to the receiver through the Out-band signal, then the SB_ID and the SSB_ID fields may be replaced with a Block Identifier (B_ID) field. The B_ID may start at 0 and may increase by 1 per source sub-block. The B_ID may be initialized to 0 after reaching the maximum value expressible with 2 bytes. At this time, the SB_ID=floor (B_ID/M), and the SSB_ID=B_ID−M*SB_ID. The function of floor(X) may denotes a maximum integer not exceeding a value of X. In an exemplary case where the source block is divided into two source sub-blocks that each include two source payloads, the SB_ID, the IP_ID_SB, the SSB_ID, and the IP_ID_SSB corresponding to FEC source payload identifiers of B_ID, IP_ID_SB, and IP_ID_SSB of the source packets SP#0, SP#1, . . . , SP#7 are as follows.

SP#0: (0, 0, 0)=>(0, 0, 0, 0)
SP#1: (0, 1, 1)=>(0, 1, 0, 1)
SP#2: (1, 2, 0)=>(0, 2, 1, 0)
SP#3: (1, 3, 1)=>(0, 3, 1, 1)
SP#4: (2, 0, 0)=>(1, 0, 0, 0)
SP#5: (2, 1, 1)=>(1, 1, 0, 1)
SP#6: (3, 2, 0)=>(1, 2, 1, 0)
SP#7: (3, 3, 1)=>(1, 3, 1, 1)

In the case of using the two-stage method, the FEC parity payload identifier may be identical with the FEC parity payload of the case using the one stage method, with the exception that the unit of information to be protected by the parity packet may be the information sub-block or information block depending on whether the parity packet including the FEC parity payload identifier is the first FEC parity packet or the second parity packet.

In the case of using the two-stage method or the LA-FEC, the joint decoding of the first and second decoders may become possible according to the FEC code design. In the case of using the joint decoding, both the IBL and PBL of each code may need to be secured. In the above described exemplary embodiment, the IBL and the PBL may be acquired by receiving only one parity packet for the corresponding FEC block. However, if the channel condition deteriorates, a specific FEC block reception failure may occur. In this case, it may not be possible to recover the information block through joint decoding logically, however, if the IBL and the PBL are not acquired, the situation may become worse if the decoding is not performed. Accordingly, in order to overcome this situation, the IBL and the PBL values may be transmitted through an extra FEC Out-band signal, as shown in Table 5. If M is included in the FEC transport information, an M field may be omitted in Table 5. Furthermore, since the IBL is the sum of all ISBL values, the IBL may also be omitted from Table 5.

TABLE 5

M
For i = 1 to M
ISBL for the i-th SSB
PBL for the i-th SSB
End for
IBL
PBL

A description is made of the exemplary Out-band signal for the joint decoding of the two-step method with the assistance of the case where the source block is divided into two source sub-blocks, wherein each source sub-block includes two source payloads, and with the first FEC code generating a one parity payload per source sub-block and the second FEC code generating a two parity payload per source block. The Out-band signal in the format of Table 5 may be structured as shown in Table 6.

TABLE 6

| Value | Description |
| --- | --- |
| 2 | Number of source sub-blocks per source block |
| 2 | Number of payloads of first information sub-block |
| 1 | Number of payloads of parity block protecting first information sub-block |
| 2 | Number of payloads of second information sub-block |
| 1 | Number of payloads of parity block protecting second information sub-block |
| 4 | Number of payloads of information block |
| 2 | Number of payloads of parity block protecting information block |

Since the entire or partial control information may be transmitted periodically or the entire or partial FEC configuration information may be transmitted through the In-band signaling of the present exemplary embodiments, a receiver may acquire the FEC configuration information in the contemporaneous service and may perform FEC decoding in order to recover the lost data, thus, providing an improvement of service quality.

As described above, the packet transmission/reception method of the present invention may improve error correction capability and network resource utilization efficiency.

It will be understood that each block of the flowchart illustrations and/or block diagrams, and combinations of blocks in the flowchart illustrations and/or block diagrams, can be implemented by computer program instructions that may be implemented and/or executed on hardware. These computer program instructions may be provided to a processor of a general purpose computer, a special purpose computer, or other programmable data processing apparatus to produce a machine, such that the instructions, which execute via the processor of the computer or other programmable data processing apparatus, are an apparatus for implementing the functions/acts specified in the flowchart and/or block diagram block or blocks. These computer program instructions may also be stored in a non-transitory computer-readable memory that can direct a computer or other programmable data processing apparatus to function in a particular manner, such that the instructions stored in the non-transitory computer-readable memory produce an article of manufacture including instruction means which implement the function and/or act specified in the flowchart and/or block diagram block or blocks. The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions and/or acts specified in the flowchart and/or block diagram block or blocks.

Furthermore, the respective block diagrams may illustrate parts of modules, segments or codes, including at least one or more executable instructions for performing at least one specific logic function. Moreover, it should be noted that the functions of the blocks may be performed in different order in several modifications. For example, two successive blocks may be performed substantially at the same time, or may be performed in reverse order according to their functions.

The term "module" according to the exemplary embodiments of the invention, means, but is not limited to, a software or hardware component, such as a Field Programmable Gate Array (FPGA), an Application Specific Integrated Circuit (ASIC), or any other similar and/or suitable software or hardware component which performs certain tasks. A module may be configured to reside on an addressable storage medium and may be configured to be executed on one or more processors. Thus, a module may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for in the components and modules may be combined into fewer components and modules or further separated into additional components and modules. In addition, the components and modules may be implemented such that they execute one or more CPUs in a device or a secure multimedia card.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A packet transmission method comprising:
generating a source packet block that includes at least one source packet, a source packet including a source payload and a source payload identifier (ID) of the source payload;
generating a repair packet block that includes at least one repair packet, a repair packet including a repair payload corresponding to at least one source payload and a repair payload ID of the repair payload; and
transmitting the repair packet block,
wherein the source payload ID includes a source payload sequence number that starts from an arbitrary value and is initialized to 0 after reaching a maximum value.

2. The packet transmission method of claim 1, wherein the repair payload ID comprises an initial sequence number indicating the source payload sequence number corresponding to a first source payload in the source packet block.

3. The packet transmission method of claim 1, wherein the repair payload ID comprises a repair payload ID for identifying the repair payload of the repair packet, and
wherein the repair payload ID starts at 0 and is incremented by 1 with each repair payload in the repair packet block.

4. The packet transmission method of claim 1 wherein the repair payload ID comprises a repair payload length indicator indicating a number of repair payload in the repair packet block.

5. The packet transmission method of claim 1, wherein the repair payload ID comprises a source payload length indicator indicating a number of source payloads included in the source packet block.

6. A packet reception method comprising:
receiving a repair packet block that includes at least one repair packet, a repair packet including a repair payload corresponding to at least one source payload and a repair payload ID of the repair payload,
wherein a source payload and a source payload identifier (ID) of the source payload are included in a source packet, at least one source packet is included in source packet block, and
wherein the source payload ID includes a source payload sequence number that starts from an arbitrary value and is initialized to 0 after reaching a maximum value.

7. The packet reception method of claim 6, wherein the repair payload ID comprises an initial sequence number indicating the source payload sequence number corresponding to a first source payload in the source packet block.

8. The packet reception method of claim 6, wherein the repair payload ID comprises a repair payload ID for identifying the repair payload of the repair packet, and
wherein the repair payload ID starts at 0 and is incremented by 1 with each repair payload in the repair packet block.

9. The packet reception method of claim 6, wherein the repair payload ID comprises a repair payload length indicator indicating a number of repair payloads included in the repair packet block.

10. The packet reception method of claim 6, wherein the repair payload ID comprises a source payload length indicator indicating a number of source payloads included in the source packet block.

11. A packet transmission apparatus, the apparatus comprising:
a transmitter for transmitting a repair packet block; and
a controller controls a packet generator for generating a source packet block that includes at least one source packet, a source packet including a source payload and a source payload identifier (ID) of the source payload, and generating the repair packet block that includes at least one repair packet, a repair packet including a repair payload corresponding to at least one source payload and a repair payload ID of the repair payload,
wherein the source payload ID includes a source payload sequence number that starts from an arbitrary value and is initialized to 0 after reaching a maximum value.

12. The packet transmission apparatus of claim 11, wherein the repair payload ID comprises an initial sequence number indicating the source payload sequence number corresponding to a first source payload in the source packet block.

13. The packet transmission apparatus of claim 11, wherein the repair payload ID comprises a repair payload ID for identifying the repair payload of the repair packet, and
wherein the repair payload ID starts at 0 and is incremented by 1 with each repair payload in the repair packet block.

14. The packet transmission apparatus of claim 11, wherein the repair payload ID comprises a repair payload length indicator indicating a number of repair payloads included in the repair packet block.

15. The packet transmission apparatus of claim 11, wherein the repair payload ID comprises a source payload length indicator indicating a number of source payloads included in the source packet block.

16. A packet reception apparatus, the apparatus comprising:
a receiver for receiving a repair packet block that includes at least one repair packet, a repair packet including a repair payload corresponding to at least one source payload and a repair payload ID of the repair payload,
wherein a source payload and a source payload identifier (ID) of the source payload are included in a source packet, at least one source packet is included in source packet block, and
wherein the source payload ID includes a source payload sequence number that starts from an arbitrary value and is initialized to 0 after reaching a maximum value.

17. The packet reception apparatus of claim 16, wherein the repair payload ID comprises an initial sequence number indicating the source payload sequence number corresponding to a first source payload in the source packet block.

18. The packet reception apparatus of claim 16, wherein the repair payload ID comprises a repair payload ID for identifying the repair payload of the repair packet, and
wherein the repair payload ID starts at 0 and is incremented by 1 with each repair payload in the repair packet block.

19. The packet reception apparatus of claim 16, wherein the repair payload ID comprises a repair payload length indicator indicating a number of repair payloads included in the repair packet block.

20. The packet reception apparatus of claim 16, wherein the repair payload ID comprises a source payload length indicator indicating a number of source payloads included in the source packet block.

* * * * *